United States Patent [19]
Fredrickson et al.

[11] Patent Number: 5,497,384
[45] Date of Patent: Mar. 5, 1996

[54] PERMUTED TRELLIS CODES FOR INPUT RESTRICTED PARTIAL RESPONSE CHANNELS

[75] Inventors: Lisa Fredrickson, Sunnyvale; Razmik Karabed, San Jose; Paul H. Siegel, San Jose; Hemant K. Thapar, San Jose, all of Calif.

[73] Assignee: International Business Machines Corporation, Armonk, N.Y.

[21] Appl. No.: 174,904

[22] Filed: Dec. 29, 1993

[51] Int. Cl.⁶ .......................... G06F 11/10; H03M 13/12
[52] U.S. Cl. ........................................... 371/43; 375/341
[58] Field of Search .............................. 371/43, 44, 45, 371/30, 39; 375/94

[56] References Cited

U.S. PATENT DOCUMENTS

| | | | |
|---|---|---|---|
| 4,888,779 | 12/1989 | Karabed et al. | 371/43 |
| 4,933,956 | 6/1990 | Forney et al. | 375/94 |
| 5,257,272 | 10/1993 | Fredrickson | 371/43 |
| 5,280,489 | 1/1994 | Fredrickson et al. | 371/45 |
| 5,327,440 | 7/1994 | Fredrickson et al. | 371/43 |
| 5,329,537 | 7/1994 | Alard et al. | 371/43 |
| 5,375,129 | 12/1994 | Cooper | 371/43 |

Primary Examiner—Roy N. Envall, Jr.
Assistant Examiner—Emmanuel L. Moise
Attorney, Agent, or Firm—Henry E. Otto, Jr.

[57] ABSTRACT

Maximum likelihood detection of a trellis code using a Viterbi detector constructed from a time-varying trellis structure that is associated with a partial response channel and consists of connected trellises with periodically repeated patterns of nodes and subtrellises of said trellises. Each subtrellis has nodes representing a current state of the channel and value of a predetermined tracked attribute. A survivor metric and a survivor sequence from a node at the end of one subtrellis are reassigned to a node at the beginning of an adjacent subtrellis having a different value of the tracked attribute for increasing minimum distance properties, reducing error event length and improving code constraints for timing and gain control. The one subtrellis and adjacent subtrellis may be within a single trellis or in adjacent trellises.

23 Claims, 10 Drawing Sheets

PERMUTED TRELLIS CODES FOR INPUT RESTRICTED PARTIAL RESPONSE CHANNELS

FIELD OF THE INVENTION

This invention relates to coding and maximum-likelihood detection of input strings or binary data applied to partial-response channels. More particularly, it relates to methods and apparatus wherein a maximum-likelihood detector employs a time-varying trellis structure with periodic permutation of states to provide coding gain as well as improved constraints for timing and gain control, reduced error-event lengths, and reduced detector complexity.

BACKGROUND OF THE INVENTION

The following prior art references are considered by applicants to be the most pertinent to the present invention:

[A] U.S. Pat. No. 4,888,779, granted Dec. 19, 1989, entitled "Matched Spectral Null Trellis Codes For Partial Response Channels."

[B] Commonly assigned U.S. application Ser. No. 07/869,286, filed Apr. 15, 1992, entitled "Time-Varying Modulo N Trellis Codes For Input Restricted Partial Response Channels," now U.S. Pat. No. 5,257,272, granted Oct. 26, 1993.

[C] Commonly assigned U.S. application Ser. No. 07/869,570, filed Apr. 15, 1992, entitled "Time-Varying Detector For Control Of Error Event Length," now U.S. Pat. No. 5,280,489, granted Jan. 18, 1994.

Partial response channels of interest for data storage devices include those with channel polynomials of the form $P(D)=(1-D^n)$ or $(1+D^n)$, where n is a nonnegative integer. Channels with this form have a practical implementation advantage in that they can be de-interleaved into n separate $(1-D)$ channels or n separate $(1+D)$ channels, respectively. In Reference [A], coding and detection are accomplished by n-way interleaving of appropriate codes for the dicode channel, with polynomial $(1-D)$, or n-way interleaving of appropriate codes for the so-called class-I partial-response channel, with polynomial $(1+D)$.

Reference [A] discloses a method for increasing the reliability of partial response storage channels by increasing the minimum distance between coded output sequences using codes designed to match the spectral nulls in a channel partial response polynomial. The Viterbi detectors in Reference [A] have reduced complexity, achieved by tracking only the spectral content of detected sequences.

The "minimum distance" of a particular detector trellis (sometimes referred to in the art as $d_{free}^2$) is defined as the minimum sum of the squared differences between sequences of noiseless sample values resulting from two distinct paths that diverge from a common state on the trellis and remerge to a common state. For partial response maximum likelihood (PRML) detection, $d_{free}^2$ is 2, but the first-order matched-spectral null codes of Reference [A] increase $d_{free}^2$ to 4. In order to realize the benefits of increased free distance in a Viterbi detector with finite path memory, it is required that any pair of sequences consisting of a coded sequence and another detector trellis sequence accumulate the distance within a finite number of samples. If the code contains "quasi-catastrophic" sequences, which are defined as sequences that are represented by more than one distinct path through the detector trellis, the minimum distance will not be accumulated in a finite number of samples, so it is necessary for the code to avoid such sequences. Reference [A] describes a method for eliminating quasi-catastrophic sequences.

Reference [B] describes a Viterbi detector which replicates a conventional trellis pattern for the desired channel N times. The N copies of the channel response trellis are interconnected in such a way that a preselected function associates each state in the trellis with a particular integer value modulo N. The number N is selected according to the channel detection and coding constraints so that diverging erroneous sequences of minimum distance lead to detector states which are distinct from the correct detector state. Only certain values of the preselected function tracked modulo N are allowed every m bits in order to increase the minimum distance between output sequences in the partial response channel and eliminate quasi-catastrophic sequences for increasing the reliability of a data storage device. The codes described in Reference [B] do not match the spectral nulls in the polynomial for the channel.

Reference [C] describes a Viterbi detector based upon a time-varying trellis structure for detection of codes with spectral nulls or spectral-density nulls. The trellis is obtained by selective deletion of states and edges from the trellis that tracks spectral content of sequences. The time-varying structure provides for reduced error-event length by eliminating paths corresponding to certain quasi-catastrophic sequences. However, in order to maintain the desired high code rates, it was necessary to significantly increase the codeword block length or the number of trellis states, resulting in larger code and detector complexity.

There is a need for a trellis coding and detection method that can achieve the high code rate, coding gain (increased minimum distance), runlength constraints for timing/gain control, and reduced error-event lengths that are necessary in storage devices, with less encoder and detector complexity than prior methods.

As herein used, the term "trellis structure" connotes a sequence of trellises, each trellis being defined as comprising one or more subtrellises at the boundaries of which a metric permutation is effected.

SUMMARY OF THE INVENTION

A method is described for designing trellis codes for partial response channels. The code design uses sequences of a specified length with constraints on their running-digital-sum (RIDS) or RDS modulo N. These sequences are concatenated according to rules that depend upon the RDS value of a sequence and that of its successor. The detector trellis structure reflects the sequence concatenation scheme by combining subtrellises that track RDS or RDS modulo N, with reassignment of survivor metrics and survivor sequences at the subtrellis boundaries according to the sequence concatenation rules. The resulting detector trellis structure therefore requires periodic permutation of states. The sequences and the concatenation rules are selected to realize coding gain, eliminate quasi-catastrophic sequences from the detector trellis, limit the complexity of the maximum-likelihood detector, and improve runlength constraints relative to prior art methods. The code resulting from this design method is referred to herein as a "permuted trellis code."

The method described is for the dicode $(1-D)$ channel, but the basic design approach applies to partial response channels of the form $1-D^n$ or $1+D^n$ through suitable interleaving and redefinition of states.

DESCRIPTION OF PREFERRED EMBODIMENTS

Figure 1:
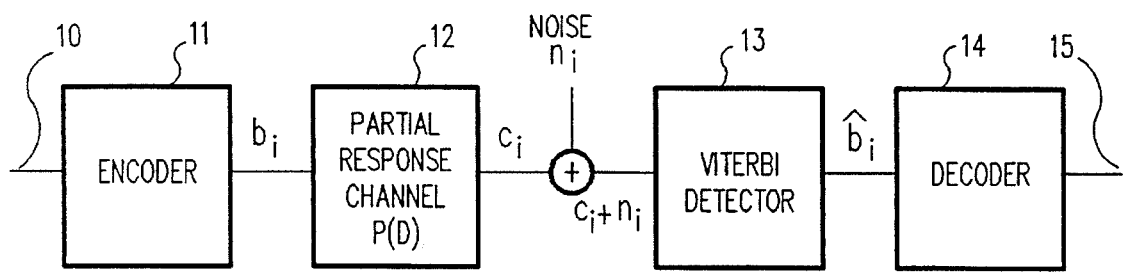
FIG. 1 is a block diagram of a data storage system comprising an encoder, a partial response channel, a decoder, and a modified Viterbi detector embodying the invention.

As depicted in FIG. 1, input data, such as in the form of binary symbol strings, is transmitted from a bus 10 to an encoder 11. Encoder 11 produces a binary code symbol sequence which serves as input to a partial response channel 12. A channel output sequence is generated by partial response channel 12, corrupted by noise, and detected at the channel output by a modified Viterbi detector 13 for implementing the invention. Detector 13 calculates and estimates, from the channel output sequence, the most probable coded sequence. A decoder 14 uses this estimate, as calculated by detector 13, to recover the original input data and output it to a bus 15. The method embodying the invention employs a time-varying periodic detector trellis structure. The trellis structure is composed of connected trellises, each trellis in turn consisting of one or more subtrellises. These subtrellises are selected to ensure that they contain no error events of distance 2. For example, such a subtrellis can be derived from a detector trellis for a matched-spectral-null (MSN) code or a Mod N code.

To generate a detector trellis structure for arbitrarily long sequences, it is necessary for the ending states of one subtrellis to be mated with the beginning states of an adjacent subtrellis, which can have either a different or the same subtrellis structure. This means that the survivor metric and survivor sequence for an ending state of the one subtrellis will then be assigned to the beginning state of the subsequent subtrellis to which it is mated. The mated states will correspond to the same value of channel memory, but not necessarily the same value of the attribute tracked by the subtrellises; e.g., the running-digital-sum (RDS) as in a MSN code detector trellis or the RDS modulo N as in a Mod N code detector trellis. Such a mating is referred to as a "state permutation." The mating of ending states and beginning states is specified so as to ensure that the resulting combined trellis will contain no distance 2 events. If there are diverging subtrellis paths, corresponding to a code sequence and any other sequence subtrellis sequence that accumulate only distance 1, a state permutation must be selected to ensure that no pair of path extensions in the subsequent adjacent subtrellis will generate a distance 2 event.

According to the invention, a number of trellis structures will hereinafter be described, each employing a specified state permutation. As illustrated in FIGS. 2–11, the permutation rule that reassigns the survivor metrics and survivor sequences always preserves the channel memory of the trellis states in the detector 13. That is, the state corresponding to channel memory 0 is mated to another state with channel memory 0, and the state corresponding to channel memory 1 is mated to another state with channel memory 1. Each of the codes provides an increase in the minimum distance $d_{free}^2$ from 2 to 4.

Figure 2:
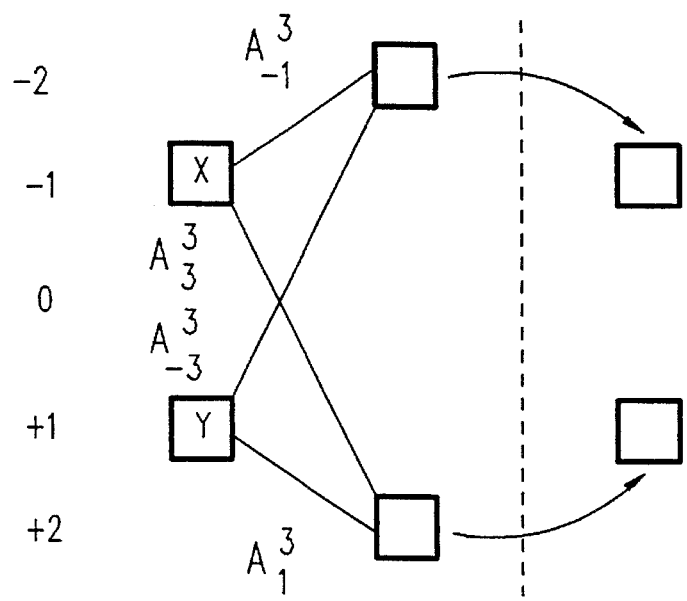
FIG. 2 shows encoded sequences and concatenation rules for a rate 2/3 permuted trellis code.

FIG. 2 is a graph depicting the encoded sequences for a rate 2/3 permuted trellis code, wherein the subsequences are RDS constrained and concatenated according to a preselected RDS-value permutation rule. The nodes represent charge states and the branches represent the accumulated charge from time 0 to 3 modulo three (3). Binary "0" and "1" are assumed to represent −1 and +1 charges, respectively. Thus, charge state +1 is connected to charge states +2 and −2 with sequences that accumulate a net charge of +1 and −3, respectively, over the three bit period. These sequences are given by:

$A_{+1}^3 = \{110, 101, 011\} A_{-3}^3 = \{000\}$.

The sets of sequences are denoted $A_{-3}^3$ and $A_{+1}^3$ in the notation convention hereinafter used, in which the superscript represents the length of the sequence and the subscript represents the number of 1's minus the number of 0's.

Similarly, state −1 is interconnected to states −2 and +2 by the set of sequences $A_{-1}^3$ and $A_{+3}^3$, where $A_{-1}^3 = \{001, 010, 100\} A_{+3}^3 = \{111\}$.

The codeword sequences are generated by encoder 11 using the encoder definition shown in Table 1, with two encoder states denoted X and Y. Table 1 and other tables hereinafter referred to are set forth in the accompanying Appendix.

The encoding rules are also depicted in FIG. 2. Since the starting and ending charge states of encoder 11 are different, it is evident that the RDS for the resulting encoded sequences is unconstrained. This is easily seen from encoding a string of an all-zeros data sequence. The encoded sequence would then be 100100100100100100 . . . , resulting in the RDS approaching minus-infinity. If the detector were designed to track the RDS, as is the usual case with matched-spectral-null (MSN) codes, the number of required states would also become unbounded. However, the state reassignments reflected in the encoding rules described above ensure that:

1) $d_{min}^2 \geq 4$, 2) quasi-catastrophic sequences are avoided, and 3) only a finite number of states are required in the detector even though the RDS for a sequence of codewords is unbounded.

Figure 3:
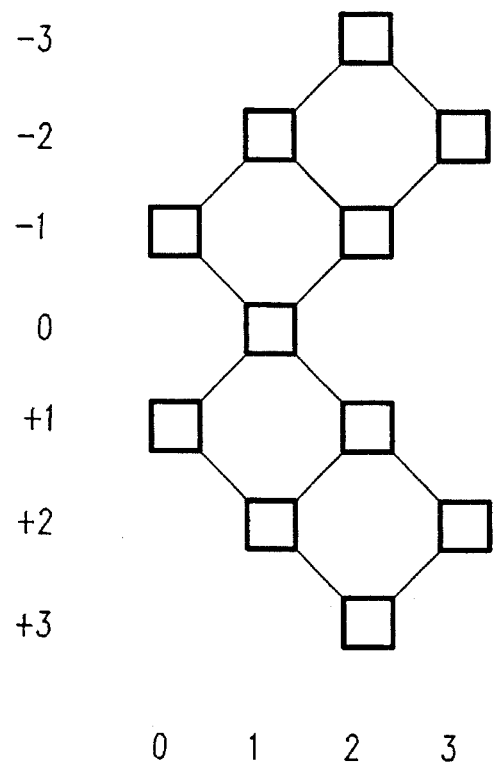
FIG. 3 shows an RDS trellis structure corresponding to codewords of a rate 2/3 permuted trellis code.

FIG. 3 shows an RDS trellis associated with encoder 11. Edges going upward represent binary "0" (a charge of −1); and edges going downward represent binary "1" (a charge of +1). Note that there are exactly four paths that emanate from each one of the origin states +1 and −1, thereby allowing for implementation of a rate 2/3 code. The detector trellis for the rate 2/3 code is obtained by suitably splitting each RDS state in FIG. 3 into two states, each of which reflects a value of channel memory associated with the (1−D) channel.

Figure 4:
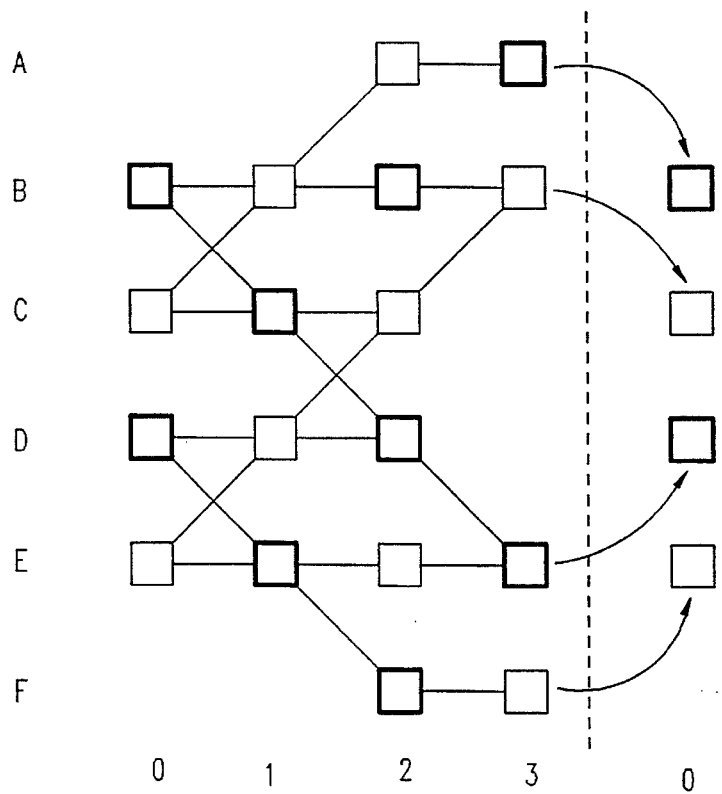
FIG. 4 shows a detector subtrellis and state permutation rule depicting outputs of a dicode (1–D) channel with inputs generated by a rate 2/3 permuted trellis code.

FIG. 4 shows the trellis diagram and state permutation for the detector derived by incorporating channel memory into the RDS trellis structure depicted in FIG. 3. For ease of reference, the trellis states have been laid out on a grid. The value of channel memory for each state is indicated by a thickened state outline for memory "1" and a thin state outline for memory "0". A channel input sequence and corresponding noiseless channel output sequence for a path from a state in column 0 to a state in column 3 are determined by the succession of values of channel memory along the path. To provide a trellis structure for a Viterbi detector, copies of the trellis in FIG. 4 are interconnected by mating pairs of ending and beginning states.

Table 2 lists the input sequences, noiseless output sequences, ending state, and ending state reassignments for the four beginning states, B0, C0, D0, E0.

In FIG. 4, the sequences corresponding to trellis paths diverging from states B0, C0, D0, E0, B1, or E1 accumulate distance at least 2 by the end of the trellis. The paths diverging from states C1 (or D1), and ending at states B3 and E3, however, generate output sequences that accumulate only distance 1. Since channel memory is to be preserved in the state reassignments, the possible state pairs in the subsequent adjacent subtrellis to be mated with {B3,E3} are {C0,B0}, (C0,D0), (E0,B0}, and {E0,D0}. Of these, all but (C0,D0) provide path extensions that remerge after accumulating additional distance of only 1. The pair {C0,D0}, however, ensures that an additional distance of at least 3 is accumulated by all possible path extensions. If channel memory is to be preserved, this assignment then forces the state pair {A3,F3} to be mated with {B0,E0}. The resulting trellis structure with state permutations has a minimum error-event distance equal to 4. The trellis structure resulting from the chosen state permutation also supports no quasi-catastrophic sequences. This follows from the fact that 0 0 0 is the only output sequence generated by distinct paths in the subtrellis (namely, path B0, C1, D2, E3 and path E0, D1, C2, B3), and the state permutations prevent the repetition of this sequence.

To summarize the key features of this embodiment, note that the state reassignment requires that each subtrellis have at least the same number of states at the ending stage (where the reassignment takes place) as at the beginning stage of the adjacent subtrellis. Moreover, as illustrated, the state reassignment is performed in a way that preserves the channel memory; i.e., ending states with a channel memory of "1" and "0" are reassigned to starting states with a channel memory of "1" and "0", respectively. Finally, the minimum distance for incomplete error events starting before the reassignment, summed with the minimum distance accumulated after the reassignment, must equal or exceed the minimum distance for the code design. In the detector trellis structure depicted in FIG. 4, it is apparent that the minimum distance for an incomplete error event before state reassignment is 1; and that after reassignment, the guaranteed additional distance for the completion of those incomplete error events is at least 3. Thus, the trellis code has a minimum distance of at least, and in fact exactly, 4.

With respect to the trellis structures of FIGS. 2, 3 and 4, it should be noted that:

1) While a systematic code was chosen to define the input-output map from state X, the input-to-output mapping is not unique, and a different data-to-codeword assignment could be used.

2) The state reassignment is not unique, and therefore a different set of sequence concatenation rules would lead to a different reassignment strategy.

3) Time-reversing the trellises in FIGS. 2, 3 or 4 would lead to a different, yet equally valid, rate 2/3 permuted trellis code.

Figure 5:
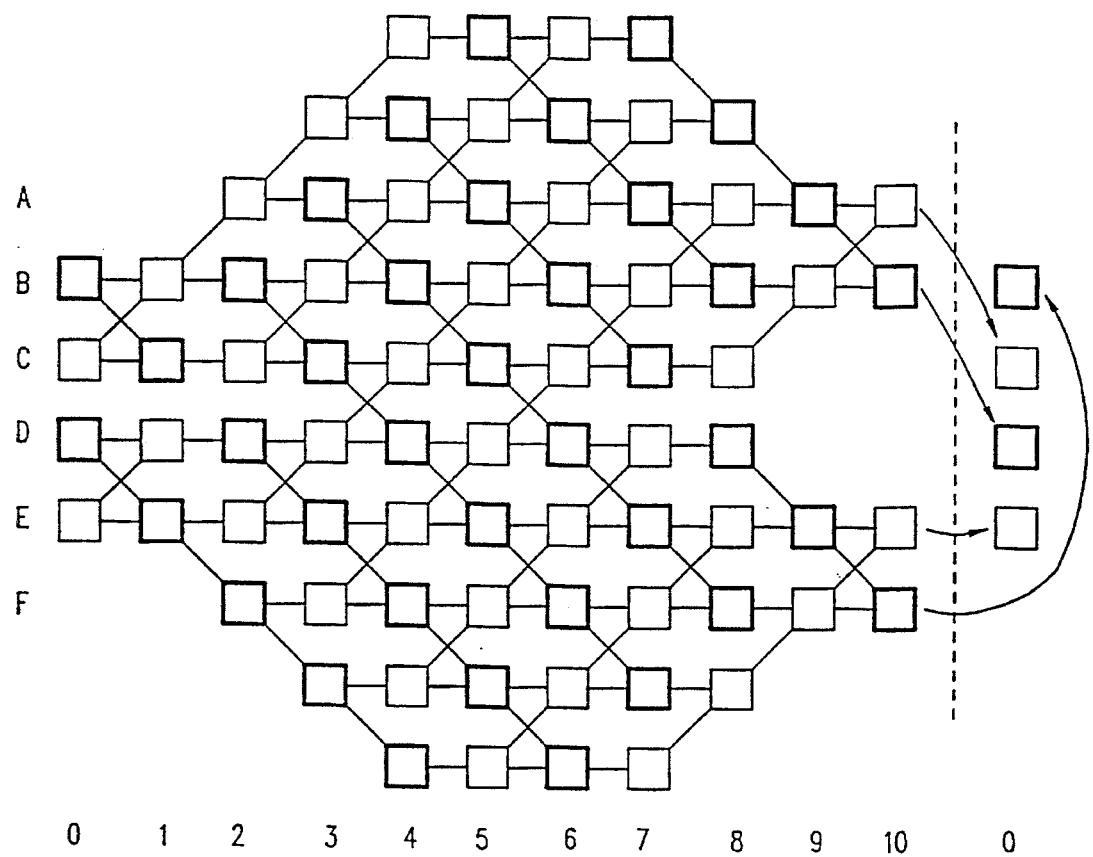
FIG. 5 shows an optimal subtrellis and state permutation rule for a dicode channel with a rate 8/10 permuted trellis code.

FIG. 5 depicts a trellis comprising a single RDS-constrained subtrellis for a rate 8/10 permuted trellis code for the dicode channel. The subtrellis supports precisely the outputs of the channel that correspond to the 256 codewords generated at each of the two states of encoder 11, corresponding to the pair of trellis states. {B0,C0} and the pair of states {D0,E0}, respectively. Hence the trellis is referred to as "optimal;" i.e., it contains no additional output sequences. State reassignment occurs every ten bits at the subtrellis boundary. Specifically, trellis states A10, B10, E10, and F10 are mated with trellis states C0, D0, E0, and B0, respectively.

Figure 6:
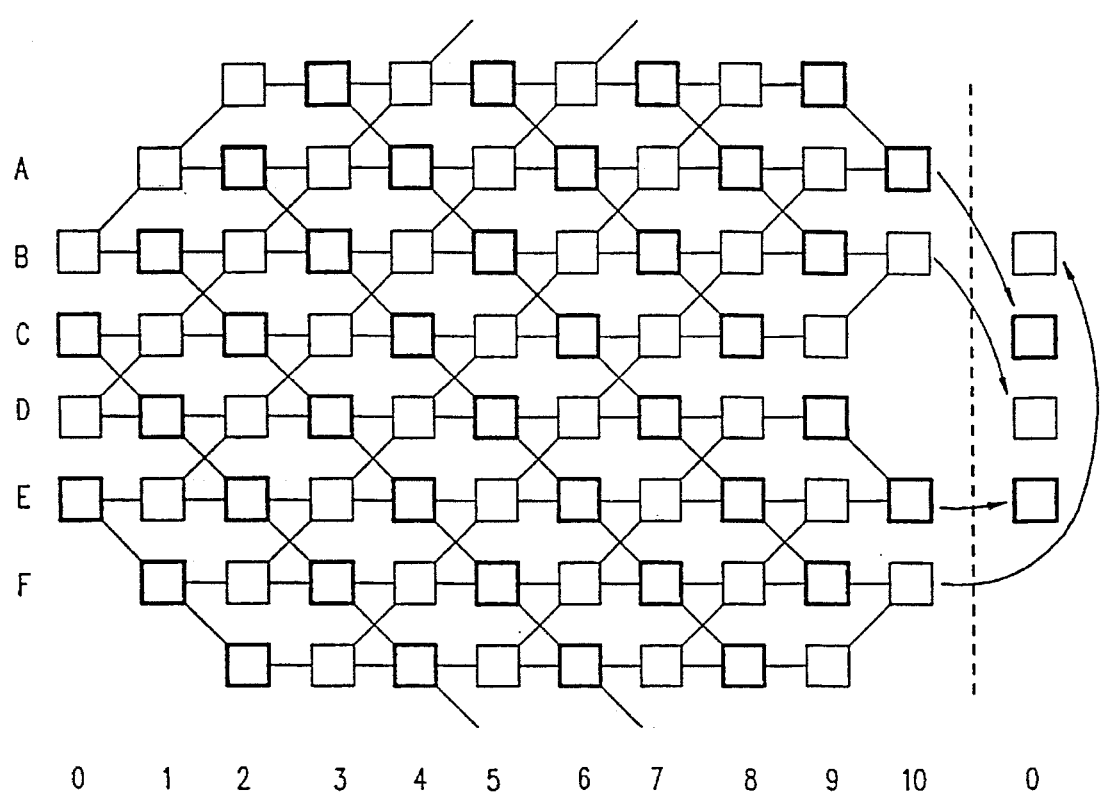
FIG. 6 shows a subtrellis and state permutation rule for a dicode channel with a rate 8/10 modulo N permuted trellis code.

FIG. 6 shows a trellis comprising a single subtrellis for a permutation code based on a rate 8/10 modulo N trellis code. There are precisely 263 trellis sequences generated from states B0 and E0, and 264 trellis sequences generated from states C0 and D0. This ensures that: there are enough code sequences of length 10 to permit a rate 8/10 encoding which requires 256 codewords per encoder state. This embodiment illustrates that the subtrellis need not be derived from a RDS-constrained code (i.e., MSN code) as was the case in the examples of FIGS. 2–5. Although this trellis is not optimal in the sense of FIG. 5, the trellis has fewer states and permits improvement of runlength constraints by careful selection of 256 codewords for each encoder state, corresponding to the trellis states B0, E0, and the pair of states {C0,D0}.

Figure 7:
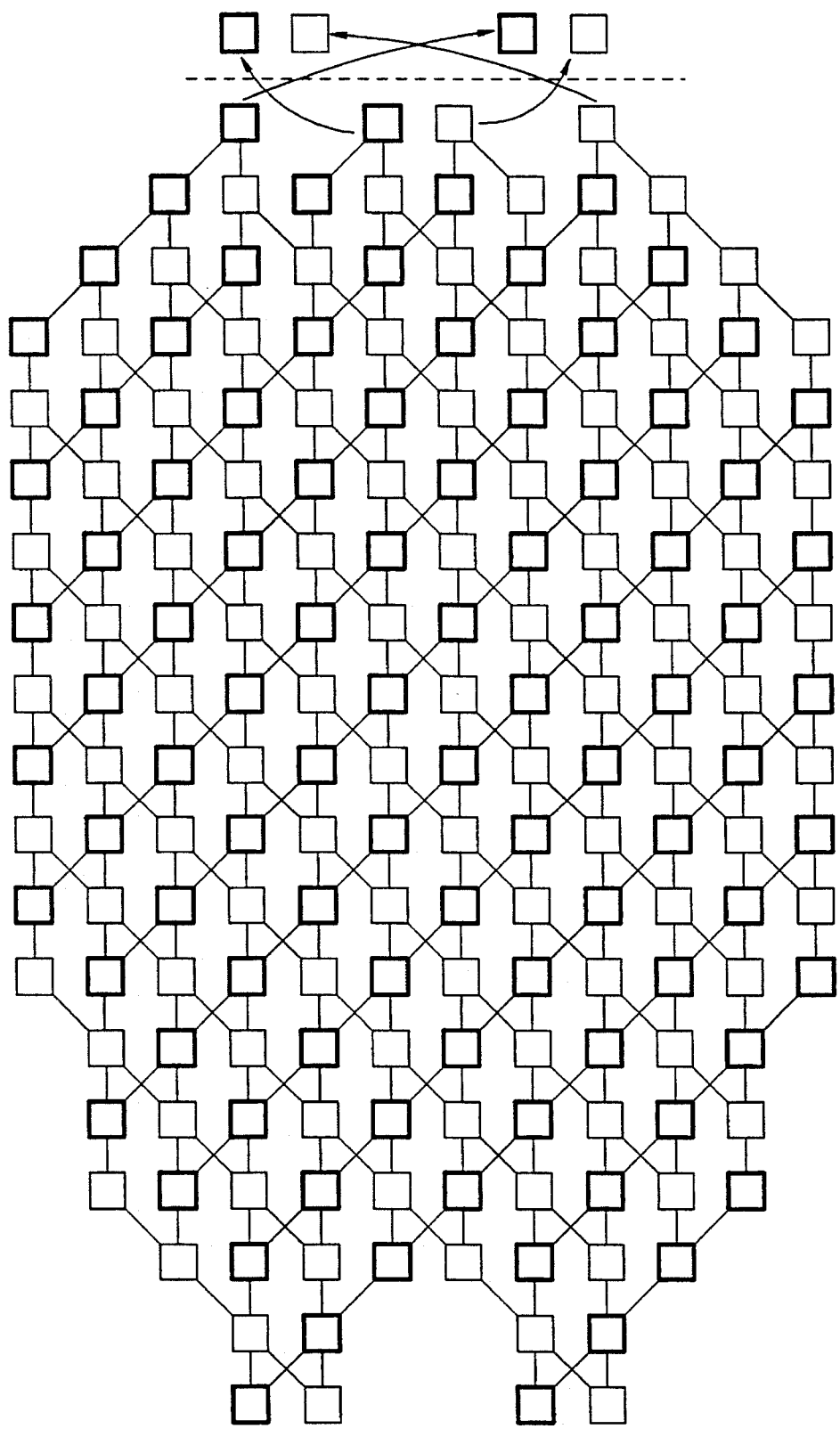
FIG. 7 shows a subtrellis and state permutation rule for a dicode channel with a rate 16/18 permuted trellis code.
Figure 8:
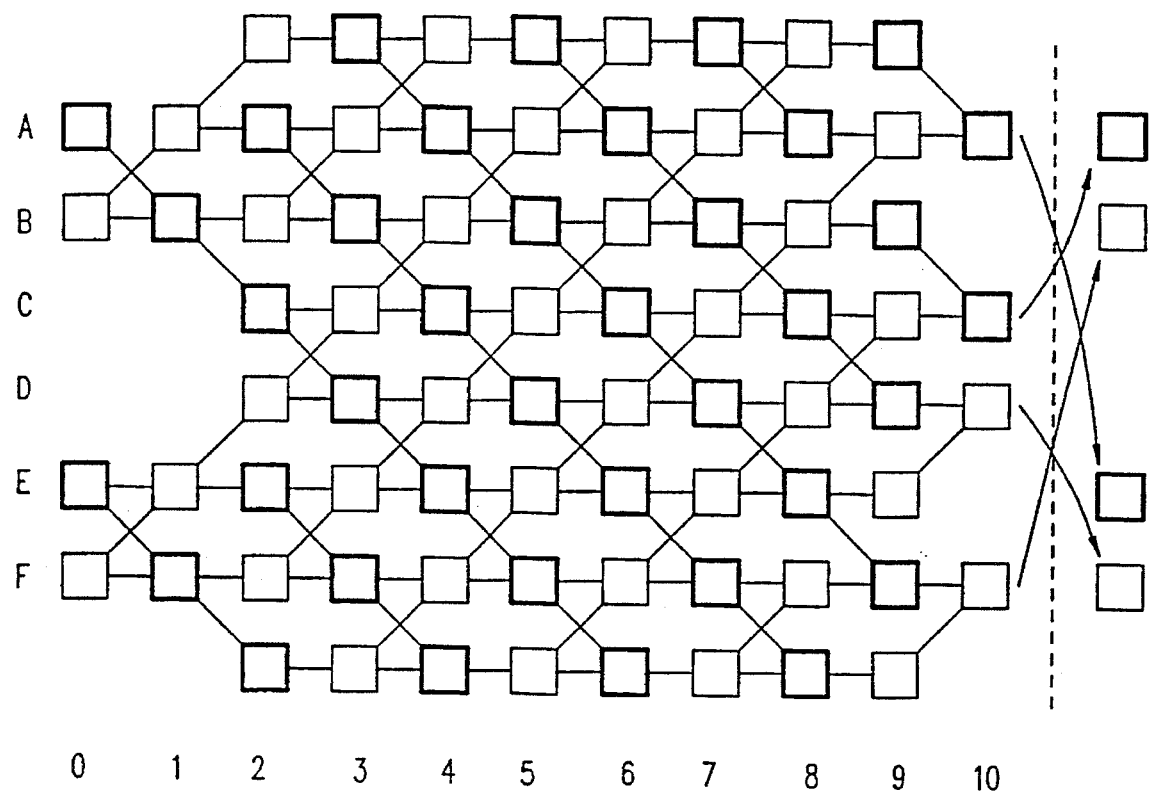
FIG. 8 shows a subtrellis and state permutation rule for a dicode channel with a rate 8/10 permuted trellis code having a permuted trellis structure compatible with that of the rate 16/18 permuted trellis code of FIG. 7.

FIGS. 7 and 8 depict trellises, each comprising a single RDS-constrained (i.e., MSN) subtrellis for a rate 16/18 coded dicode channel and a rate 8/10 coded dicode channel, respectively, with compatible state permutation rules. In FIG. 7, there are two encoder states corresponding to the pair of trellis states {A0,B0} and {E0,F0}, respectively; and trellis states A18, C18, D18, and F18 are mated with trellis states E0, A0, F0, and B0, respectively. In FIG. 8, there are two encoder states corresponding to the pair of trellis states {A0,B0} and {E0,F0}, respectively; and trellis states A10, C10, D10, and F10 are mated with trellis states E0, A0, F0, and B0. The trellis for the rate 16/18 code requires 12 states, while that of the rate 8/10 code requires 8 states. Since these two codes employ the same permutation rule at their codeword boundaries, a detector trellis structure can be implemented in a manner that can support both codes.

In the trellis of FIG. 7, there are 67,388 sequences of length 18 generated from each beginning state, thereby providing many options for selecting the 65,536 code sequences; required for a rate 16/18 code.

In the trellis of FIG. 8, there are 281 sequences of length 10 generated from each beginning state, thereby providing enough to select the 256 code sequences required for a rate 8/10 code.

Each of the permutation codes thus far described in connection with FIGS. 2–8 uses a state reassignment rule that is invoked periodically at the end of each trellis (i.e., codeword), each trellis comprising only one subtrellis. The following examples depict rate 8/10 trellis codes where the state permutation is performed at a position other than at the end of the trellis (i.e., codeword). That is, the trellises comprise more than one distinct subtrellis.

Figure 9:
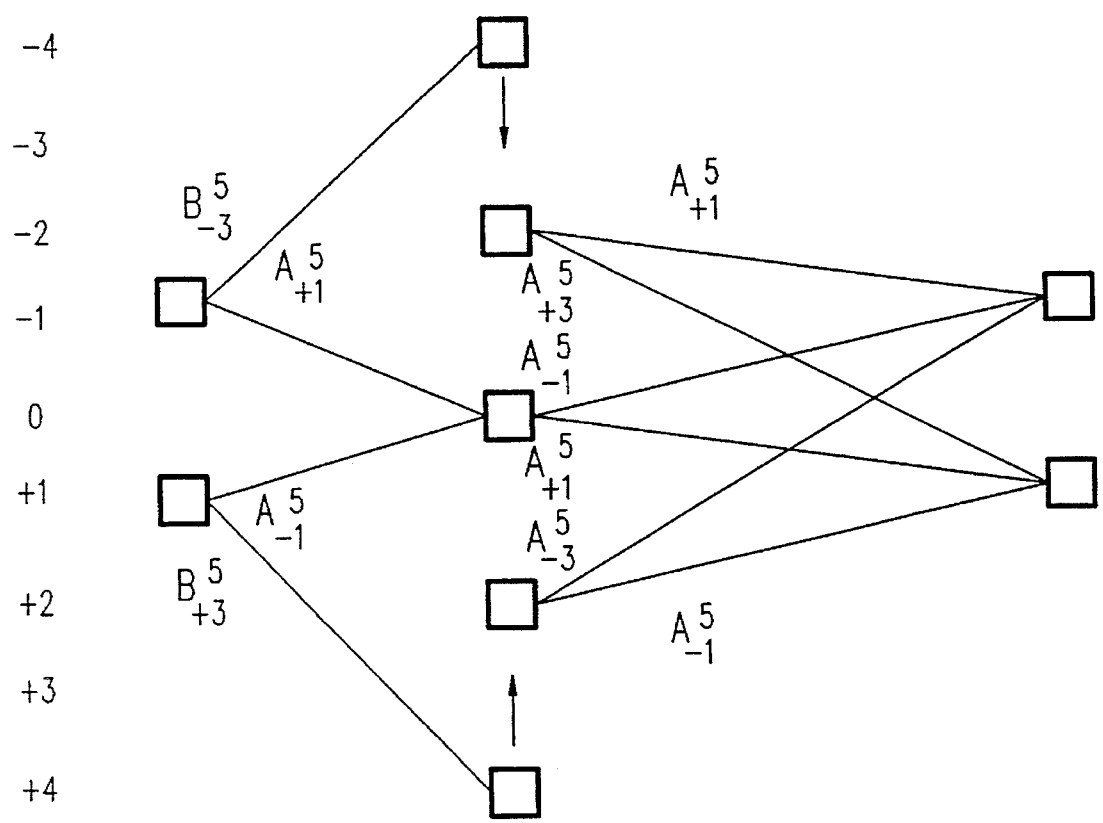
FIG. 9 shows encoded sequences and a concatenation rule for a rate 8/10 permuted trellis code with specified RDS-value permutations internal to codewords.

FIG. 9 is a graph depicting codeword sequences. By analogy to FIG. 2, the nodes represent RDS states and the edges represent the set of length five sequences with a prescribed accumulated charge. The 10-bit codewords are formed by concatenating two 5-tuples according to the interconnections shown in FIG. 9. The set of sequences $A_{+a}^5$ consists of the ten binary 5-tuples containing three 1's and two 0's. The set of sequences $A_{-1}^5$ consists of the ten binary 5-tuples containing two 1's and three 0's. The set of sequences $A_{+3}^5$ consists of the five binary 5-tuples containing four 1's and one 0. The set of sequences $A_{-3}^5$ consists of the five binary 5-tuples containing one 1 and four 0's.

The set of sequences denoted $B_{-3}^5$ consists of the four binary 5-tuples containing one (1) 1 and four 0's with the additional constraint that the last symbol in the 5-tuple must be 0. The set of sequences denoted $B_{+3}^5$ consists of the four binary 5-tuples containing four 1's and four 0's with the additional constraint that the last symbol in the 5-tuple must be 1. The codeword sequences generated from state −1 are as follows:

$B_{-3}^5 A_{+3}^5$ (20 sequences)
$B_{-3}^5 A_{+1}^5$ (40 sequences)
$A_{+1}^5 A_{+1}^5$ (100 sequences)
$A_{+1}^5 A_{-1}^5$ (100 sequences)

making a total of 260 sequences.

The codewords generated from state +1 are the complements of the codewords generated from state −1, thus providing 180-degree phase invariance. The 260 codewords from each state exceed the number required to define a rate 8/10 code. The excess codewords provide flexibility to enable selection of codewords optimizing the maximum runlength of 0's and avoiding specific patterns.

Figure 10:
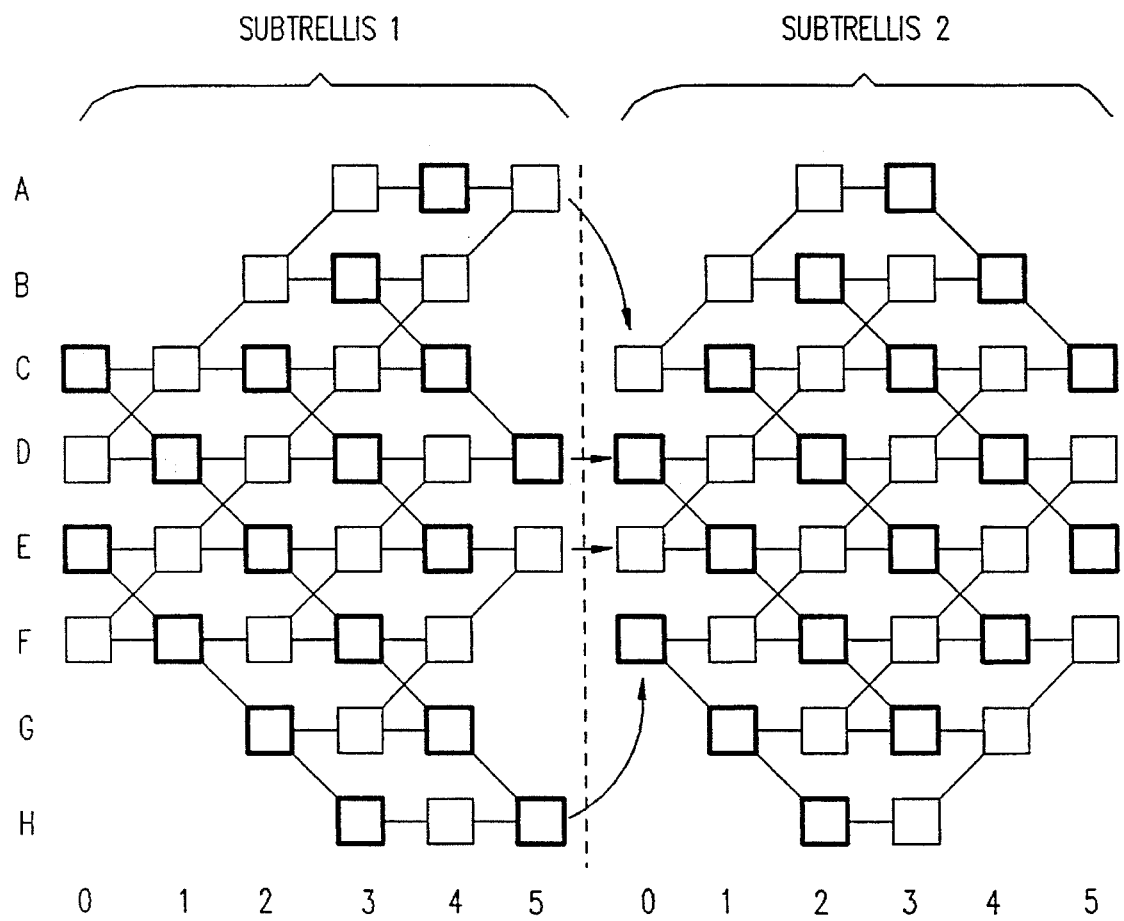
FIG. 10 is a trellis for the rate 8/10 coded dicode channel of FIG. 9, showing two distinct subtrellises, each of length five (5) code symbols, wherein the corresponding state permutation occurs at the midpoint of the codeword period.

FIG. 10 shows the trellis diagram for the dicode channel output sequences generated by the input sequences of FIG. 9. As illustrated, the state permutation is performed in the middle of the codeword, i.e., at the boundary between two subtrellises, each of which represents length-5 sequences. Note that states A5, D5, E5, and H5 of subtrellis 1 are mated with states C0, D0, E0, and F0 of subtrellis 2.

Figure 11:
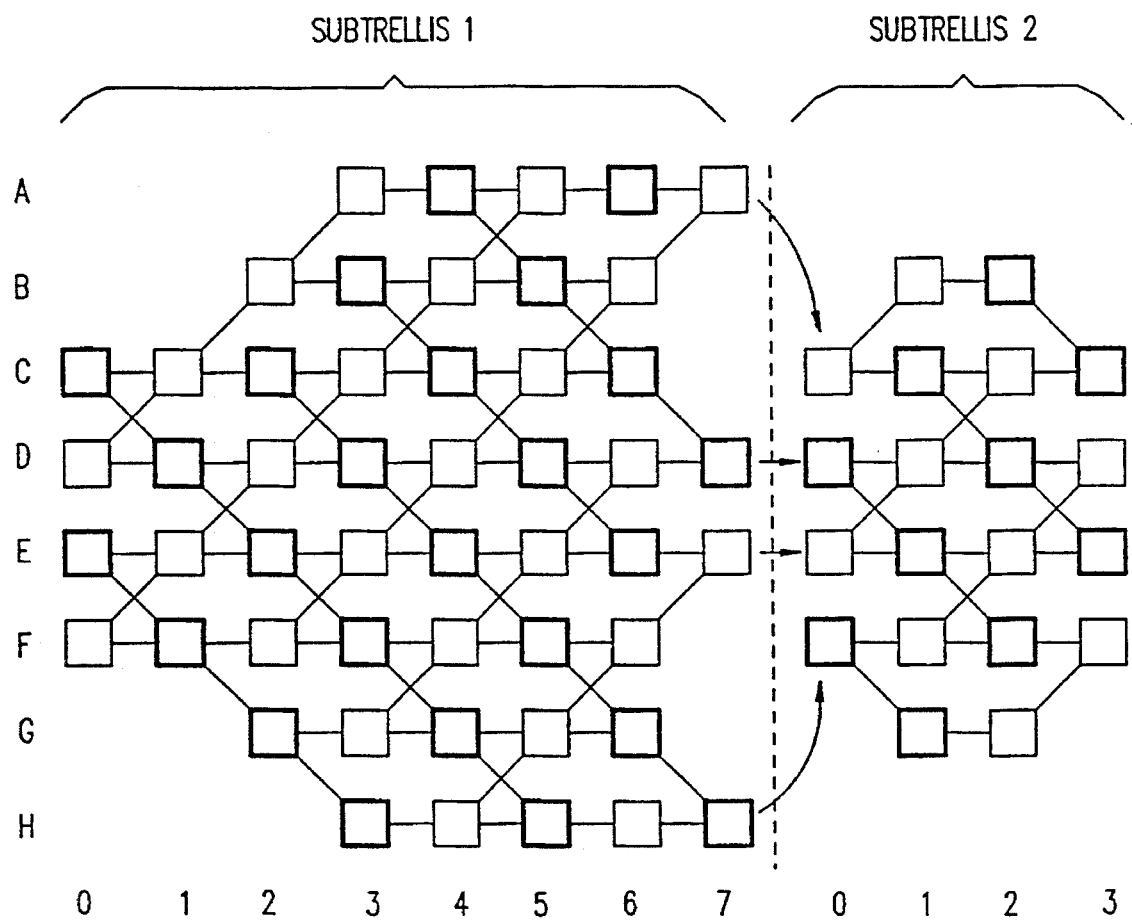
FIG. 11 is a trellis for an alternative rate 8/10 coded dicode channel, showing two distinct subtrellises of length seven (7) code symbols and length three (3) code symbols, respectively, wherein the corresponding state permutation occurs internal to codeword boundaries at a point offset from the midpoint of the codeword period.

Finally, FIG. 11 illustrates the detector trellis for a rate 8/10 code in which the state permutation is applied internal to the codeword period at a position that is offset from the middle of the 10-bit codeword. That is, the permutation is performed at the boundary between two subtrellises, one of which represents sequences of length seven while the other represents sequences of length three. States A7, D7, E7, and H7 of subtrellis 1 are mated with states C0, D0, E0, and F0 of subtrellis 2.

As in the conventional implementation of a Viterbi detector, the apparatus for effecting state permutation uses add-compare-select (ACS) processors with a specified pattern of interconnections, the number of ACS units and their linkages reflecting the trellis structure underlying the detector. Time-varying features of the trellis structure, in particular the state permutations and corresponding reassignments of survivor metrics and survivor sequences, are implemented by the use of control lines and multiplexers.

Figure 12:
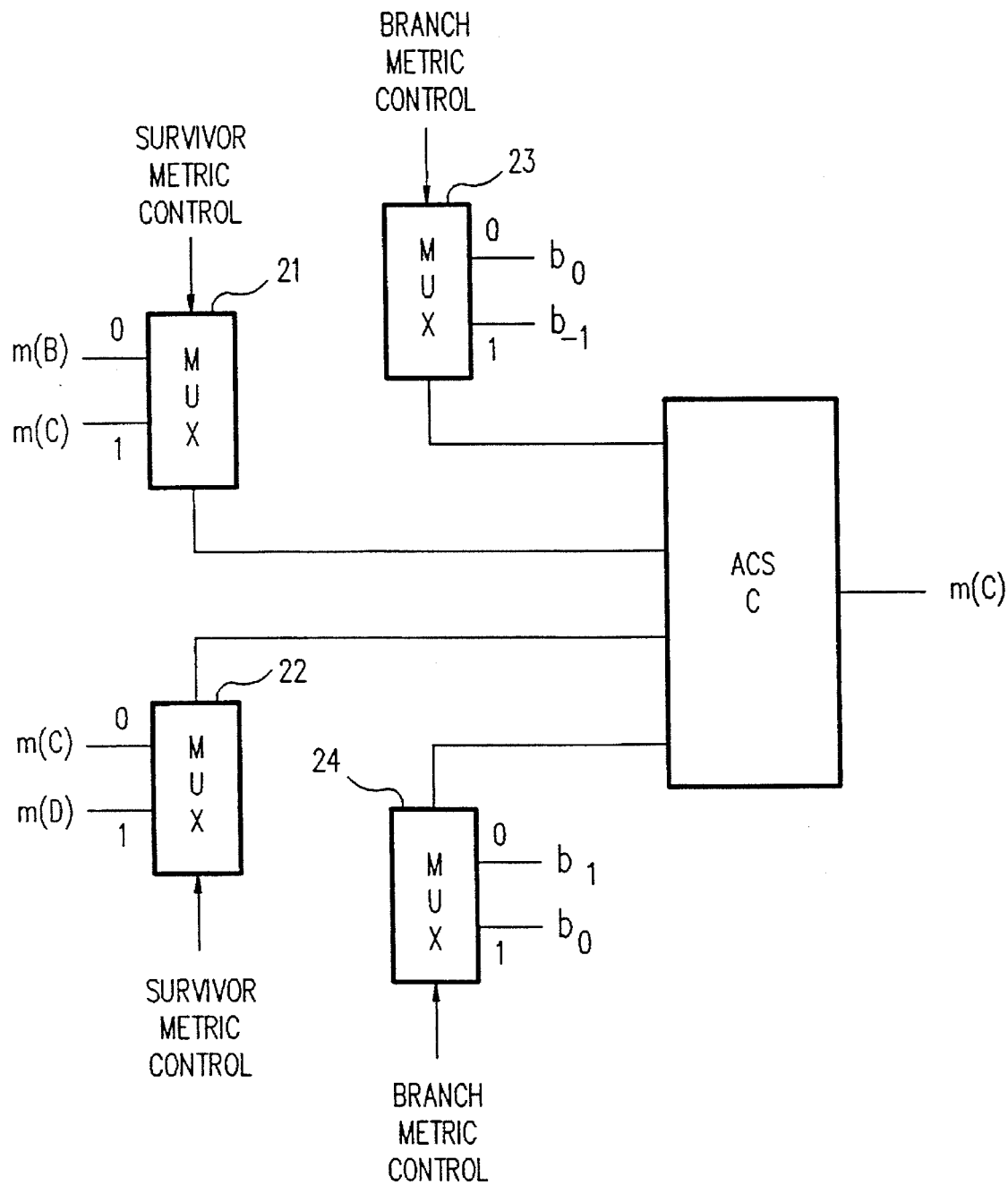
FIG. 12 shows an apparatus for implementing time-varying add-compare-select (ACS) computations, including the state permutation, for ACS C of the detector subtrellis in FIG. 4.

FIG. 12 depicts a portion of a detector apparatus corresponding to ACS C, including multiplexers and control lines that, in response to a specified periodic sequence of survivor-metric control signals and branch-metric control signals corresponding to the detector trellis of FIG. 4 implement the time-varying ACS computations determined by the schedule of Table 3. Table 3 shows the ACS input/output connections, i.e., the survivor metrics and branch metrics that are provided to each ACS processor at each time instant, periodically with period 3.

More specifically, and referring to both Table 3 and FIG. 12, at time 1 a new channel sample is received. The survivor-metric control signal is set to value 0, selecting as input to multiplexer (MUX) 21 the survivor metric m(B), and selecting as input to multiplexer 22 the survivor metric m(C). At the same time, the branch-metric control signal is set to value 0, selecting as input to multiplexer 23 the branch metric generated by the received sample with respect to the noiseless sample 0, denoted $b_0$, and selecting as input to multiplexer 24 the branch metric generated by the received sample with respect to the noiseless sample one (1), denoted $b_1$. The selected values are supplied to the ACS unit C, where the sums $m(B)+b_0$ and $m(C)+b_1$ are computed. The smaller of the two sums is then selected and output from ACS unit C as m(C) to be used at the next stage of the algorithm.

In the next iteration, stage 2, the survivor-metric control signal is set to 1 and the branch-metric control signal is set to 1. The resulting selections at the multiplexers 21, 22 and multiplexers 23, 24 direct the specified inputs to ACS unit C which, in turn, selects the minimum of the two sums $m(C)+b_{-1}$ and $m(D)+b_0$ to be output as m(C) for the next stage.

The third iteration, stage 3, leads in completely analogous fashion to the selection of the minimum of the sums $m(B)+b_{-1}$ and $m(C)+b_0$ to be output as m(C) for the next stage. Note that this third iteration effectively incorporates the state permutation, as shown in Table 3.

The control sequences repeat periodically with period 3, thereby causing the cycle of the three iterations described above to repeat. A similar approach can be used for the remaining ACS units.

While the invention has been shown and described with respect to preferred embodiments thereof, it will be understood by those skilled in the art that changes in form and detail may be made in these embodiments without departing from the scope and teaching of the invention. Accordingly, the method and detector apparatus herein disclosed are to be considered merely as illustrative, and the invention is to be limited only as specified in the claims.

TABLE 1

| State | Encoder Input | Encoder Output | Next State |
|---|---|---|---|
| X | 00 | 100 | X |
|   | 01 | 001 | X |
|   | 10 | 010 | X |
|   | 11 | 111 | Y |
| Y | 00 | 011 | Y |
|   | 01 | 110 | Y |
|   | 10 | 101 | Y |
|   | 11 | 000 | X |

TABLE 2

| Beginning State | Channel Memory | Input Sequence | 1-D Output | Ending State | State Reassignment |
|---|---|---|---|---|---|
| B0 | 1 | 001 | -101 | A3 | B0 |
|   |   | 010 | -11-1 | B3 | C0 |
|   |   | 100 | 0-10. | B3 | C0 |

TABLE 2-continued

| Beginning State | Channel Memory | Input Sequence | 1-D Output | Ending State | State Reassignment |
|---|---|---|---|---|---|
| | | 111 | 000 | E3 | D0 |
| C0 | 0 | 001 | 001 | A3 | B0 |
| | | 010 | 01-1 | B3 | C0 |
| | | 100 | 1-10 | B3 | C0 |
| | | 111 | 100 | E3 | D0 |
| D0 | 1 | 110 | 00-1 | F3 | E0 |
| | | 101 | 0-11 | E3 | D0 |
| | | 011 | -110 | E3 | D0 |
| | | 000 | -100 | B3 | C0 |
| E0 | 0 | 110 | 10-1 | F3 | E0 |
| | | 101 | 1-11 | E3 | D0 |
| | | 011 | 010 | E3 | D0 |
| | | 000 | 000 | B3 | C0 |

TABLE 3

ACS Input/Output (from FIG. 4)

| State/Time | 1 | 2 | 3 | 0 |
|---|---|---|---|---|
| A | — | m(B),0 | m(A),1 ⟶ | Đ |
| B | { m(B),−1 ; m(C),0 } | m(B),1 | { m(B),−1 ; m(C),0 } ⟶ m(A),1 | |
| C | { m(B),0 ; m(C),1 } | { m(C),−1 ; m(D),0 } | Đ | { m(B),−1 ; m(C),0 } |
| D | { m(D),−1 ; m(E),0 } | m(D),1 | Đ | { m(D),0 ; m(E),1 } |
| | | m(E),−1 | | |
| E | { m(D),0 ; m(E),1 } | m(E),0 | { m(D),0 ; m(E),1 } ⟶ m(F),−1 | |
| E | — | | m(F),−1 ⟶ | |

We claim:

1. A method of maximum likelihood detection of a trellis code, comprising the steps of:

constructing a Viterbi detector from a time-varying trellis structure that is associated with a partial response channel and consists of connected trellises with periodically repeated patterns of nodes and subtrellises of said trellises, each subtrellis having nodes representing a current state of the channel and a value of a predetermined tracked attribute; and reassigning a survivor metric and a survivor sequence from a node at the end of one subtrellis to a node at the beginning of an adjacent subtrellis having a different value of the tracked attribute for increasing minimum distance between sequences supported by the trellis structure.

2. The method of claim 1, wherein said one subtrellis and adjacent subtrellis are within a single trellis.

3. The method of claim 1, wherein said one subtrellis and adjacent subtrellis are contained in adjacent trellises.

4. The method of claim 1, including the step of mating any nodes at said end of said one subtrellis not reassigned during the reassigning step with nodes remaining at the beginning of said adjacent subtrellis having identical values of the tracked attribute.

5. The method of claim 1, including the step of developing the trellis code from nonidentical interconnected subtrellises by specifying sequences supported by each of the subtrellises and concatenation rules consistent with state permutations in the trellis structure.

6. The method of claim 1, wherein the tracked attribute is the running-digital-sum (RDS).

7. The method of claim 1, wherein the tracked attribute is the running-digital-sum (RDS) Mod N, where N is a proselected positive integer.

8. A method of maximum likelihood detection of a trellis code, comprising the steps of:

constructing a Viterbi detector from a time-varying trellis structure associated with a partial response channel and consisting of connected trellises repeated at equal periodic intervals and subtrellises of said trellises, each subtrellis having nodes representing a current state of the channel and a value of a predetermined tracked attribute; and mating at least one pair of nodes at the proximate ends of adjacent subtrellises that have different values of the tracked attribute by reassigning the value of one of said pair of nodes to the other of said pair.

9. The method of claim 8, including the steps of:

tracking the predetermined attribute for each of a plurality of codewords, corrupted by noise, received from the channel; and establishing the length of a codeword as the periodic interval, for reducing error event length and improving code constraints for timing and gain control.

10. A method for maximum likelihood detection of a trellis code, comprising the steps of:

using an encoder, encoding sequences of digital electrical signals constituting input data into codewords consisting of sequences of coded bits;

inputting said codewords to a partial response channel;

supplying a channel response to the codewords, corrupted by noise, to a Viterbi detector;

constructing the Viterbi detector from connected trellises that are associated with the channel, each trellis repeated in periodic fashion and comprising subtrellises with nodes representing a current state of the channel and a value of a predetermined tracked attribute of each codeword;

reassigning a survivor metric and survivor sequence from a node at the end of one subtrellis to a node having a different value of the tracked attribute at the beginning of an adjacent subtrellis to provide a time-varying trellis structure with periodic state metric permutations ensuring prospecified minimum distance properties; and using the Viterbi detector to provide as output sequences maximum likelihood estimates of the sequences of coded bits.

11. The method of claim 10, wherein each state metric permutation is invoked at the end of a codeword.

12. The method of claim 10, wherein each state metric permutation is invoked at at least one preselected position within a codeword.

13. A method of creating a rate x/y trellis code, comprising the steps of:

specifying sets of sequences and concatenation rules which will generate a collection of y-length code sequences ensuring prespecified minimum distance properties;

encoding a series of x-length sequences into y-length code sequences;

using said sets and rules, generating a trellis structure comprising connected trellises, each consisting of at least one subtrellis, each subtrellis having nodes representing a current state of a partial response channel and a value of a predetermined tracked attribute; and mating at least one pair of nodes at the proximate ends of adjacent subtrellises that have different values of the tracked attribute by reassigning the value of one of said pair of nodes to the other said pair.

14. The method of claim 13, wherein said collection of y-length sequences also permits reduced error event length and improved code constraints for timing and gain control.

15. The method of claim 13, wherein the number of y-length sequences exceeds the number of y-length sequences encodable by a rate x/y encoder, and including the step of selecting for encoding by the encoder a set of y-length sequences that will optimize preselected properties of the code.

16. Apparatus for maximum likelihood detection of a rate x/y trellis code, comprising:

an encoder for encoding a series of x-length sequences of digital electrical signals constituting input data into codewords, each consisting of a series of y-length sequences of coded bits;

a partial response channel for receiving said codewords from the encoder;

a Viterbi detector for receiving from the channel responses to the codewords, corrupted by noise, to provide output sequences constituting maximum likelihood estimates of said codewords, said Viterbi detector being constructed from trellises that are associated with the channel and track a predetermined attribute of each codeword, each trellis (i) having a period equal to the length of at least one codeword and (ii) comprising subtrellises with nodes representing a current state of the channel and a value of the tracked attribute, at least one pair of the end nodes of adjacent subtrellises having different values, said detector comprising means for reassigning a survivor metric and survivor sequence of one of said nodes of the pair to the other node of said pair to provide a time-varying trellis structure with periodic state metric permutations for providing selected minimum distance properties between output sequences supported by the time-varying trellis structure; and a decoder for converting into an estimate of the input data sequences output by the detector as maximum likelihood estimates of the sequences of the coded bits.

17. The apparatus of claim 16, wherein said end nodes of the adjacent subtrellises are within the same trellis.

18. The apparatus of claim 16, wherein said end nodes of the adjacent subtrellises are in adjacent trellises.

19. For use in an apparatus for maximum likelihood detection of a trellis code, a Viterbi detector with a time-varying trellis structure with periodic state metric permutations comprising connected trellises repeated in periodic fashion and subtrellises of the trellises, each subtrellis having nodes representing a current state of a partial response channel and a value of a predetermined tracked attribute, a node at the end of one subtrellis having a survivor metric and survivor sequence reassigned to a node at the beginning of an adjacent subtrellis, for providing selected minimum distance properties between output sequences supported by the time-varying trellis structure.

20. The Viterbi detector of claim 19, wherein any nodes not reassigned at said end of said one subtrellis are mated with nodes remaining at the beginning of said adjacent subtrellis having identical values of the tracked attribute.

21. The Viterbi detector of claim 19, wherein each state metric permutation is invoked at at least one preselected position within a codeword.

22. The Viterbi detector of claim 19, wherein said end nodes of the adjacent subtrellises are within the same trellis.

23. The Viterbi detector of claim 19, wherein said end nodes of the adjacent subtrellises are in adjacent trellises.

* * * * *

UNITED STATES PATENT AND TRADEMARK OFFICE
CERTIFICATE OF CORRECTION

PATENT NO. : 5,497,384
DATED : March 5, 1996
INVENTOR(S) : Fredrickson et al.

It is certified that error appears in the above-indentified patent and that said Letters Patent is hereby corrected as shown below:

Column 1, line 8, delete " or ", insert -- of --

Signed and Sealed this

Tenth Day of September, 1996

Attest:

BRUCE LEHMAN

Attesting Officer     Commissioner of Patents and Trademarks